United States Patent
Hundt et al.

(10) Patent No.: US 6,815,262 B2
(45) Date of Patent: Nov. 9, 2004

(54) APPARATUS AND METHOD FOR ATTACHING AN INTEGRATED CIRCUIT SENSOR TO A SUBSTRATE

(75) Inventors: Michael J. Hundt, Double Oak, TX (US); Tiao Zhou, Irving, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/201,087

(22) Filed: Jul. 22, 2002

(65) Prior Publication Data

US 2004/0012084 A1 Jan. 22, 2004

(51) Int. Cl.[7] .......................... H01L 21/44; H01L 21/48; H01L 21/20
(52) U.S. Cl. .......................... 438/127; 438/26; 438/124; 438/125
(58) Field of Search .......................... 264/271.1, 271.11, 264/272.17; 438/25, 26, 127, 125, 126, 121, 124, 55, 64, 51

(56) References Cited

U.S. PATENT DOCUMENTS

2002/0088632 A1 * 7/2002 Salatino et al. ............ 174/52.1
2003/0148556 A1 * 8/2003 Zhou et al. ................ 438/127

* cited by examiner

Primary Examiner—Craig A. Thompson
Assistant Examiner—Thanhha Pham
(74) Attorney, Agent, or Firm—Lisa K. Jorgenson; William A. Munck

(57) ABSTRACT

A method of fabricating an integrated circuit sensor package. The method comprises the steps of: 1) mounting a substrate on a first mold block, the substrate comprising a substantially planar material having a first substrate surface and a second substrate surface that contacts a mounting surface of the first mold block; 2) placing an adhesive on the first substrate surface; 3) placing an integrated circuit sensor on the adhesive; and 4) pressing a second mold block against the first substrate surface. The second mold block comprising a cavity portion for receiving the integrated circuit sensor, a contact surface surrounding the cavity portion, and a compliant layer mounted with the cavity portion. Pressing the second mold block against the first substrate surface causes the contact surface to form with the first substrate surface a seal surrounding the integrated circuit sensor. Pressing also causes the compliant layer to press against a sensor array surface of the integrated circuit sensor, thereby pressing the integrated circuit sensor into the adhesive and the first substrate surface.

20 Claims, 4 Drawing Sheets

APPARATUS AND METHOD FOR ATTACHING AN INTEGRATED CIRCUIT SENSOR TO A SUBSTRATE

TECHNICAL FIELD OF THE INVENTION

The present invention is generally directed to apparatuses and methods for fabricating integrated circuit (IC) sensors and, more specifically, to an apparatus and method for attaching an IC sensor to a substrate.

BACKGROUND OF THE INVENTION

Many integrated circuit (IC) devices do not encapsulate the entire IC chip in a protective package. For example, an IC sensor chip used in a fingerprint reader is a touch chip device that uses a sensor array to read a finger print. In order to work properly, the sensor array must be at least partially exposed in order to receive the finger of a user.

For these types of devices, it is necessary to package the IC sensor chip in such a way that the edges and wires of the IC sensor chip are protected, but the sensor array remains completely exposed. The packaging is usually accomplished using some kind of molding process. However, this process is made more difficult by the need to prevent molding flash from forming on the IC sensor and by the need to compensate for variation in die thickness and die tilt. The exposed IC sensor is brittle and must be handled carefully to prevent it from shattering.

Therefore, there is a need in the art for improved processes for fabricating integrated circuit packages that contain an at least partially exposed integrated circuit sensor.

SUMMARY OF THE INVENTION

To address the above-discussed deficiencies of the prior art, it is a primary object of the present invention to provide a method of fabricating an integrated circuit sensor package. According to an advantageous embodiment of the present invention, the method comprises the steps of: 1) mounting a substrate on a first mold block, the substrate comprising a substantially planar material having a first substrate surface on a first side and a second substrate surface on an opposing second side, such that the second substrate surface contacts a mounting surface of the first mold block; 2) placing an adhesive on the first substrate surface; 3) placing an integrated circuit sensor on the adhesive; and 4) pressing a second mold block against the first substrate surface, the second mold block comprising a cavity portion for receiving the integrated circuit sensor, a contact surface surrounding the cavity portion, and a compliant layer mounted with the cavity portion, wherein pressing the second mold block against the first substrate surface causes the contact surface to form with the first substrate surface a seal surrounding the integrated circuit sensor and further causes the compliant layer to press against a sensor array surface of the integrated circuit sensor, thereby pressing the integrated circuit sensor into the adhesive and the first substrate surface.

According to one embodiment of the present invention, the method further comprises the step of 5) injecting an encapsulant material into the cavity portion of the second mold block.

According to another embodiment of the present invention, the compliant layer forms a seal with the sensor array surface of the integrated circuit sensor, thereby preventing the encapsulant material from contacting the sensor array surface.

According to still another embodiment of the present invention, the method further comprises the steps of: 6) allowing sufficient time for the adhesive and the encapsulant material to set, thereby fixing the integrated circuit sensor to the first substrate surface and forming a protective package that encapsulates the integrated circuit sensor while leaving the sensor array surface exposed; and 7) removing the first and second mold blocks.

According to yet another embodiment of the present invention, the method further comprises the step of 8) pressing a clamping block associated with the first mold block against a portion of the second substrate surface opposite a position of the integrated circuit sensor on the first substrate surface.

According to a further embodiment of the present invention, the step of pressing the clamping block against the portion of the second substrate surface causes the first substrate surface to press against the integrated circuit and the adhesive, thereby pressing the sensor array surface of the integrated circuit sensor more tightly against the compliant layer.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. In particular, a controller may comprise a data processor and an associated memory that stores instructions that may be executed by the data processor. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit mold.

Figure 1:
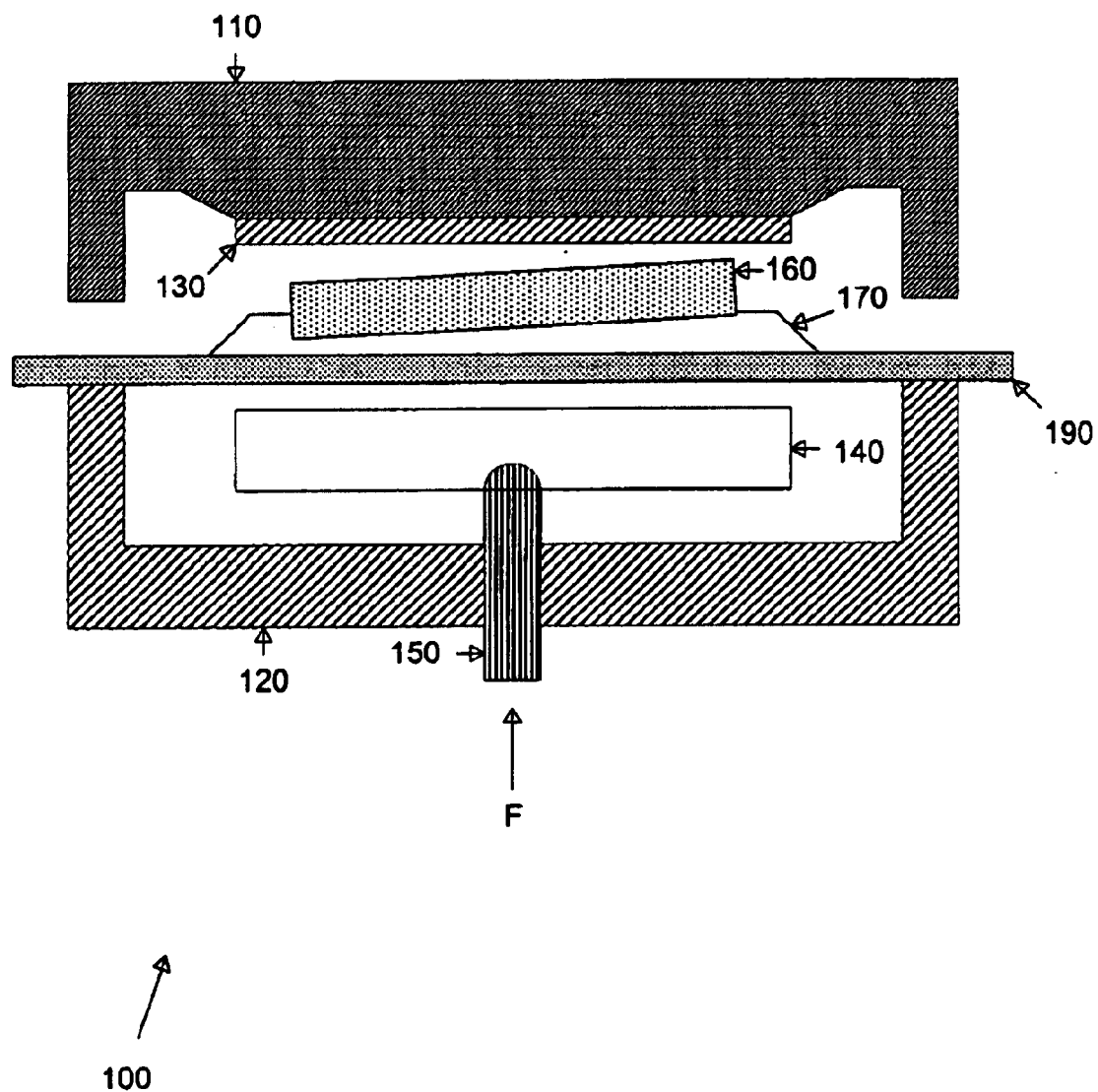
FIG. 1 illustrates an exemplary sensor mold prior to clamping according to one embodiment of the present invention.

FIG. 1 illustrates exemplary sensor mold 100 prior to clamping according to one embodiment of the present invention. Sensor mold 100 comprises upper mold block 110, lower mold block 120, compliant layer 130, clamp block 140, and shaft 150. In FIG. 1, sensor mold 100 is shown in the open position, before upper mold block 110 and lower mold block 120 are pressed together. Substrate 190 is positioned on top of lower mold block 120. Integrated circuit (IC) sensor 160 is placed in adhesive layer 170 for subsequent attachment to substrate 190. In a real world environment, IC sensor 160 initially sits unevenly in adhesive 170 and is, therefore, not perfectly parallel to the surface of substrate 190, as depicted in FIG. 1.

Figure 2:
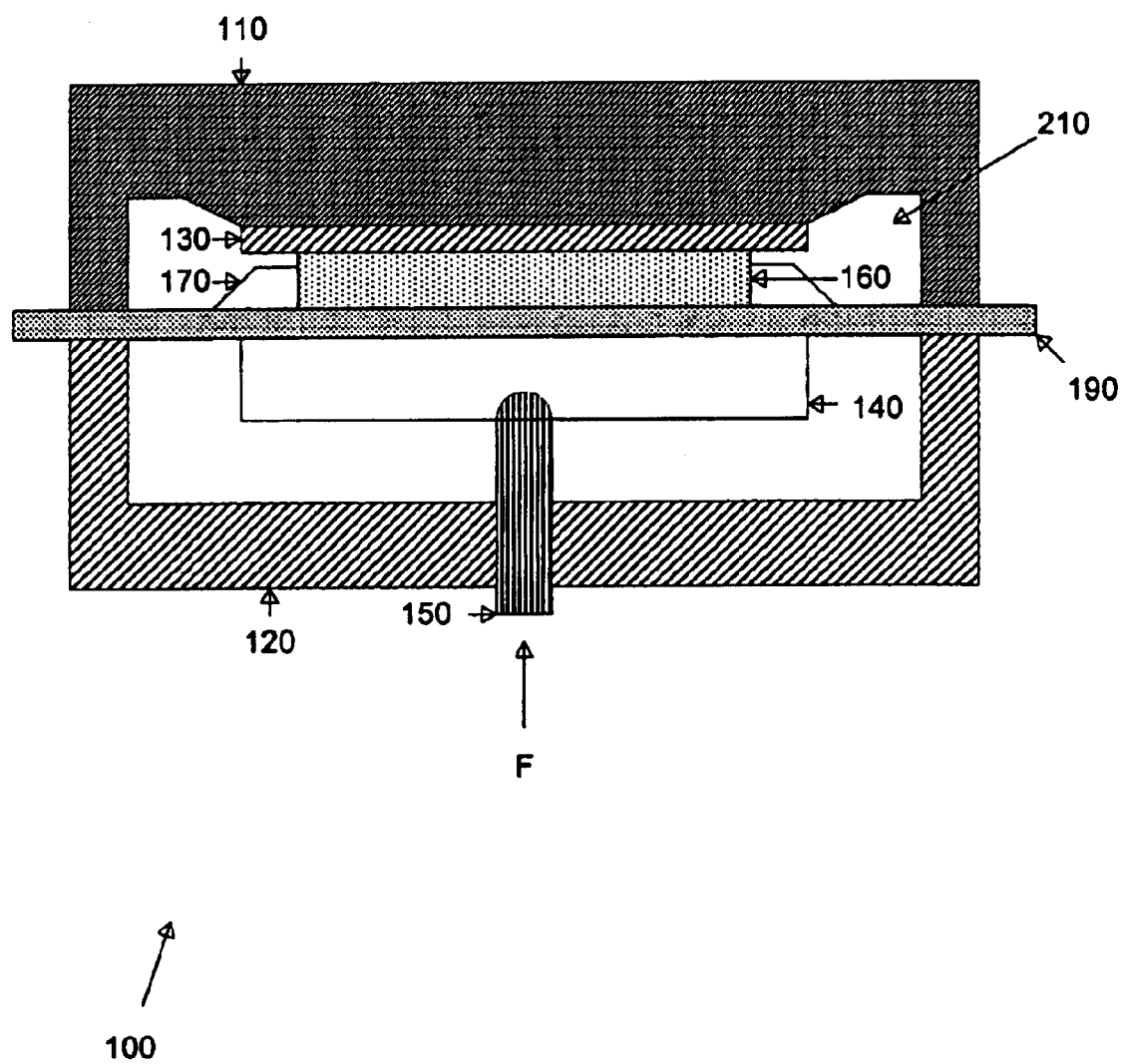
FIG. 2 illustrates the exemplary sensor mold after clamping and injection of an encapsulant material according to one embodiment of the present invention.

FIG. 2 illustrates exemplary sensor mold 100 after clamping and injection of encapsulant material 210 according to one embodiment of the present invention. In FIG. 2, sensor mold 100 is shown in the closed position, after upper mold block 110 and lower mold block 120 have been pressed together and after shaft 150 has pressed clamping block 140 against the bottom surface of substrate 190 immediately under the position of IC sensor 160. The closure of upper mold block 110 and lower mold block 120 and the upward force F applied by shaft 150 presses IC sensor 160 into compliant layer 130. This causes compression of compliant layer 130 and distributes the pressure evenly across the surface of IC sensor 160. Additionally, clamping block 140 is rotatably mounted by means of gimbal to the end of shaft 150, so that clamping block 140 makes evenly distributed contact across the bottom surface of substrate 190.

Figure 3:
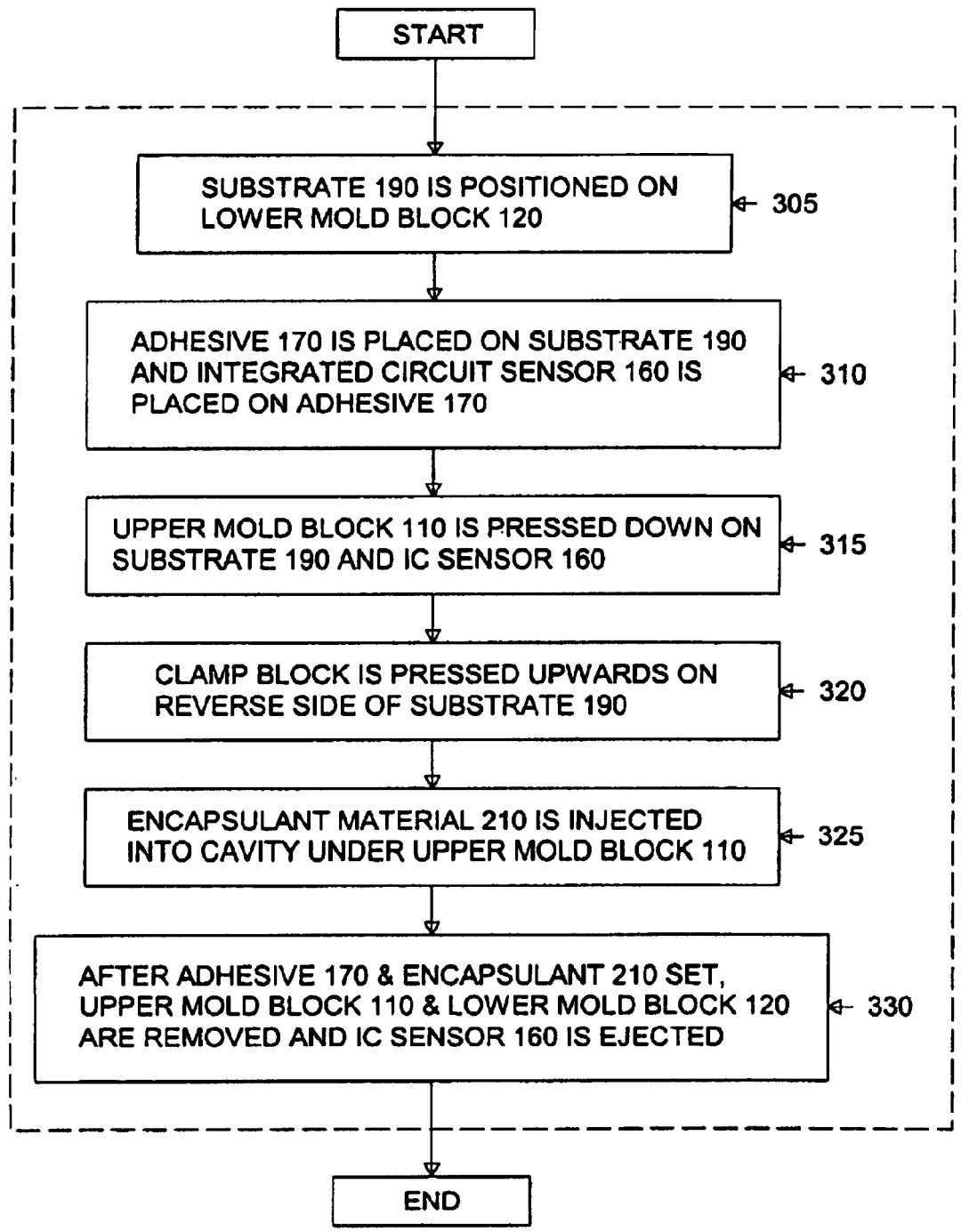
FIG. 3 is a flow diagram illustrating the exemplary molding process according to one embodiment of the present invention.

FIG. 3 depicts flow diagram 300, which illustrates the exemplary molding process according to one embodiment of the present invention. Initially, substrate 190 is positioned on lower mold block 120 (process step 305). Next, adhesive 170 is placed on substrate 190 and integrated circuit sensor 160 is placed on adhesive 170 (process step 310). When integrated circuit sensor 160 is in place, upper mold block 110 is pressed down on substrate 190 and integrated circuit sensor 160 (process step 315). Additionally, clamp block 140 is pressed upwards on the reverse side of substrate 190 until the sensor surface is in contact with upper mold block 110 (process step 320).

The force on integrated circuit 160 presses integrated circuit 160 into compliant layer 130. This forms a tight seal, much like a gasket. Next, encapsulant material 210 is injected into the cavity under upper mold block 110 (process step 325). After adhesive 170 and encapsulant material 210 are set, upper mold block 110 and lower mold block 120 are removed and integrated circuit sensor 160 is ejected (process step 330).

Figure 4:
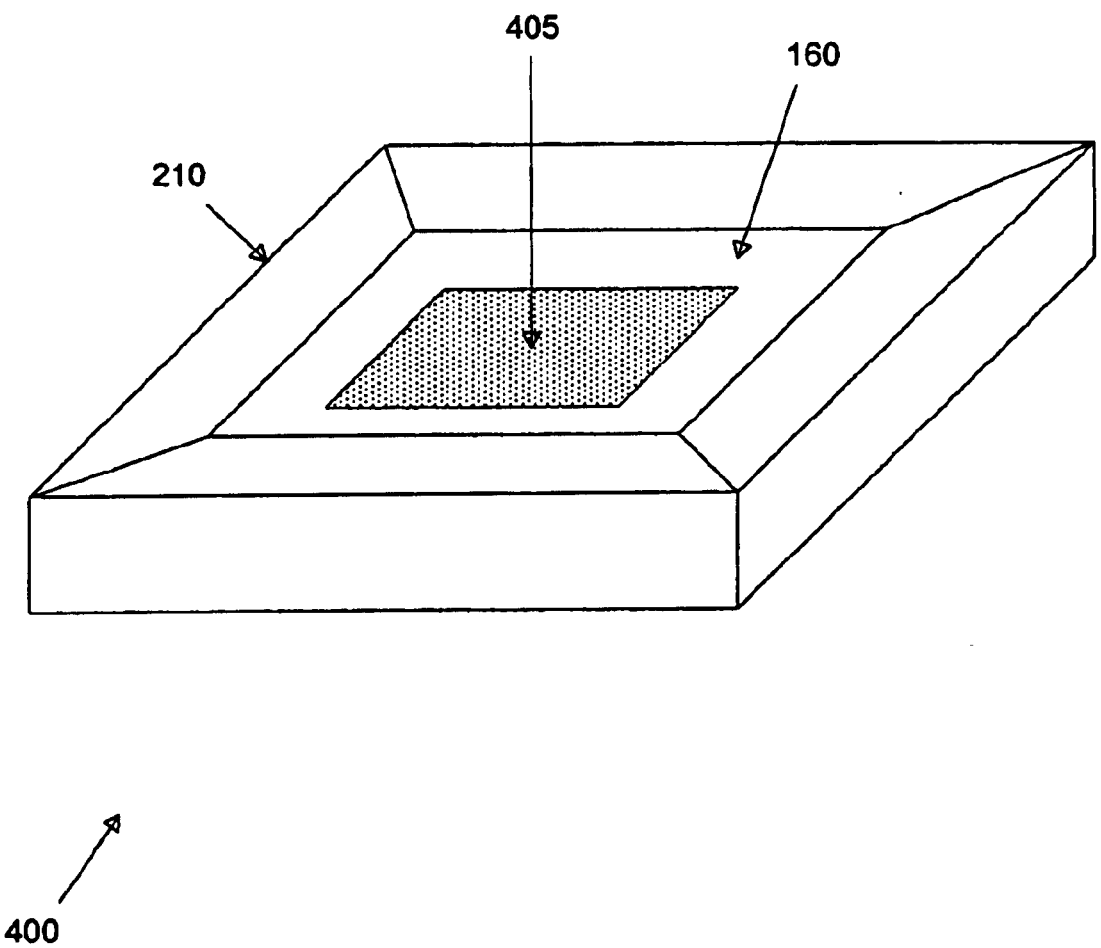
FIG. 4 illustrates an exemplary sensor package fabricated in accordance with the principles of the present invention.

FIG. 4 illustrates exemplary sensor package 400 fabricated in accordance with the principles of the present invention. As FIG. 4 shows, encapsulant material 210 surrounds integrated circuit sensor 160 without covering the top surface of integrated circuit sensor 160. For simplicity, substrate 190 on which integrated circuit sensor 160 is mounted is not shown. Sensor array 405 on the top surface of integrated circuit sensor 160 is exposed, thereby permitting sensor 405 to function (i.e., read fingerprints, scan an object, and the like).

With the present invention, small changes in chip planarity and tilt are absorbed by the flexure of the integrated substrate in the gaps. Sufficient force (F) is applied by shaft 150 and clamping block 140 to seal the sensor area against compliant layer 130 to prevent molding compound leakage. Clamping of the outer edge of the substrate is accomplished in the usual way.

Upper mold block 110 preferably has a compliant surface, but could also be a polished steel surface. Silicone rubber or a fluorocarbon polymer acts as a gasket on upper mold block 110 (i.e., touches the top surface of the die). The sidewall-gap is critical for tilt compensation. Tool life is a major advantage of the present invention, since if lower mold block 120 was a solid piece, the gasket would wear out much quicker because silicon is very hard. In an alternative embodiment of the present invention, the entire assembly may be inverted such that compliant layer 130 may be on the lower mold rather than the top mold.

Although the present invention has been described in detail, those skilled in the art should understand that they can make various changes, substitutions and alterations herein without departing from the spirit and scope of the invention in its broadest form.

What is claimed is:

1. A method of fabricating an integrated circuit sensor package comprising the steps of:

mounting a substrate on a first mold block, the substrate comprising a substantially planar material having a first substrate surface on a first side and a second substrate surface on an opposing second side, such that the second substrate surface contacts a mounting surface of the first mold block;

placing an adhesive on the first substrate surface;

placing an integrated circuit sensor on the adhesive; and pressing a second mold block against at least a portion of the first substrate surface and pressing a clamping block associated with the first mold block against at least a portion of the second substrate surface using a shaft, the second mold block comprising a cavity portion for receiving the integrated circuit sensor, a contact surface surrounding the cavity portion, and a compliant layer mounted with the cavity portion, wherein pressing the second mold block against the first substrate surface and pressing the clamping block against the second substrate surface causes the contact surface to form with the first substrate surface a seal surrounding the integrated circuit sensor and further causes the compliant layer to press against a sensor array surface of the integrated circuit sensor, thereby pressing the integrated circuit sensor into the adhesive and the first substrate surface.

2. The method as set forth in claim 1 further comprising the steps of:
   allowing sufficient time for the adhesive to set, thereby fixing the integrated circuit sensor to the first substrate surface; and
   removing the first and second mold blocks.

3. The method as set forth in claim 1 further comprising the step of injecting an encapsulant material into the cavity portion of the second mold block.

4. The method as set forth in claim 3 wherein the compliant layer forms a seal with the sensor array surface of the integrated circuit sensor, thereby preventing the encapsulant material from contacting the sensor array surface.

5. The method as set forth in claim 4 further comprising the steps of:
   allowing sufficient time for the adhesive and the encapsulant material to set, thereby fixing the integrated circuit sensor to the first substrate surface and forming a protective package that encapsulates portions of the integrated circuit sensor while leaving the sensor array surface exposed; and
   removing the first and second mold blocks.

6. A method of fabricating an integrated circuit sensor package, comprising the steps of:
   mounting a substrate on a first mold block, the substrate comprising a substantially planar material having a first substrate surface on a first side and a second substrate surface on an opposing second side, such that the second substrate surface contacts a mounting surface of the first mold block;
   placing an adhesive on the first substrate surface;
   placing an integrated circuit sensor on the adhesive;
   pressing a second mold block against at least a portion of the first substrate surface, the second mold block comprising a cavity portion for receiving the integrated circuit sensor, a contact surface surrounding the cavity portion, and a compliant layer mounted with the cavity portion, wherein pressing the second mold block against the first substrate surface causes the contact surface to form with the first substrate surface a seal surrounding the integrated circuit sensor and further causes the compliant layer to press against a sensor array surface of the integrated circuit sensor, thereby pressing the integrated circuit sensor into the adhesive and the first substrate surface; and
   pressing a clamping block associated with the first mold block against at least a portion of the second substrate surface opposite a position of the integrated circuit sensor on the first substrate surface.

7. The method as set forth in claim 6 wherein the step of pressing the clamping block against the portion of the second substrate surface causes the first substrate surface to press against the integrated circuit and the adhesive, thereby pressing the sensor array surface of the integrated circuit sensor more tightly against the compliant layer.

8. The method as set forth in claim 7 further comprising the steps of:
   allowing sufficient time for the adhesive to set, thereby fixing the integrated circuit sensor to the first substrate surface; and
   removing the first and second mold blocks.

9. The method as set forth in claim 7 further comprising the step of injecting an encapsulant material into the cavity portion of the second mold block.

10. The method as set forth in claim 9 wherein the compliant layer forms a seal with the sensor array surface of the integrated circuit sensor, thereby preventing the encapsulant material from contacting the sensor array surface.

11. The method as set forth in claim 10 further comprising the steps of:
    allowing sufficient time for the adhesive and the encapsulant material to set, thereby fixing the integrated circuit sensor to the first substrate surface and forming a protective package that encapsulates portions of the integrated circuit sensor while leaving the sensor array surface exposed; and
    removing the first and second mold blocks.

12. A method of fabricating an integrated circuit sensor package, comprising the steps of:
    mounting a substrate having a first surface and an opposing second surface on and contacting a first mold block;
    placing an adhesive on the first surface of the substrate;
    placing an integrated circuit sensor on the adhesive; and
    pressing a second mold block against at least a portion of the first surface of the substrate and pressing a clamping block associated with the first mold block against at least a portion of the second surface of the substrate, the pressings causing a compliant layer to come into contact with the integrated circuit sensor and press the integrated circuit sensor into the adhesive, the compliant layer forming a seal with the integrated circuit sensor.

13. The method of claim 12, further comprising the step of:
    injecting an encapsulant material into a cavity formed between the second mold block and the substrate.

14. The method of claim 13, wherein the seal between the compliant layer and the integrated circuit sensor prevents the encapsulant material from contacting a sensor array surface of the integrated circuit sensor.

15. The method of claim 13, further comprising the steps of:
    allowing sufficient time for the adhesive and the encapsulant material to set, thereby fixing the integrated circuit sensor to the first surface of the substrate and forming a protective package that encapsulates portions of the integrated circuit sensor while leaving the sensor array surface of the integrated circuit sensor exposed; and
    removing the first and second mold blocks.

16. The method of claim 12, further comprising the steps of:
    allowing sufficient time for the adhesive to set, thereby fixing the integrated circuit sensor to the first surface of the substrate; and
    removing the first and second mold blocks.

17. The method of claim 12, wherein pressing the clamping block against the second surface of the substrate comprises pressing the clamping block against the second surface of the substrate using a shaft.

18. The method of claim 17, wherein pressing the clamping block against the second surface of the substrate distributes pressure from the compliant layer evenly across a surface of the integrated circuit sensor.

19. The method of claim 18, wherein:
    the clamping block is rotatably mounted to the shaft; and
    pressing the clamping block against the second surface of the substrate distributes contact evenly across at least a portion of the second surface of the substrate.

20. The method of claim 12, wherein placing the integrated circuit sensor on the adhesive comprises placing the integrated circuit sensor unevenly on the adhesive.

* * * * *